(12) United States Patent
Ashouei et al.

(10) Patent No.: US 9,425,795 B2
(45) Date of Patent: Aug. 23, 2016

(54) CIRCUIT AND METHOD FOR DETECTION AND COMPENSATION OF TRANSISTOR MISMATCH

(71) Applicant: Stichting IMEC Nederland, Eindhoven (NL)

(72) Inventors: Maryam Ashouei, Waalre (NL); Tobias Gemmeke, Straelen (DE)

(73) Assignee: Stichting IMEC Nederland (NL)

( * ) Notice: Subject to any disclaimer, the term of this patent is extended or adjusted under 35 U.S.C. 154(b) by 0 days.

(21) Appl. No.: 14/772,834

(22) PCT Filed: Mar. 5, 2014

(86) PCT No.: PCT/EP2014/054229
§ 371 (c)(1),
(2) Date: Sep. 4, 2015

(87) PCT Pub. No.: WO2014/135573
PCT Pub. Date: Sep. 12, 2014

(65) Prior Publication Data
US 2016/0013792 A1   Jan. 14, 2016

(30) Foreign Application Priority Data
Mar. 7, 2013  (EP) .................................. 13158266

(51) Int. Cl.
*H03K 19/003* (2006.01)
*H03K 19/00* (2006.01)
(Continued)

(52) U.S. Cl.
CPC ......... *H03K 19/00384* (2013.01); *G01R 17/02* (2013.01); *G11C 29/021* (2013.01);
(Continued)

(58) Field of Classification Search
CPC ............ G01R 17/02; H03K 19/0021; H03K 19/0027; H03K 19/00369; H03K 19/00384; H03K 2217/0018
USPC ............ 324/123 R; 327/530, 534, 535, 537, 327/538, 543
See application file for complete search history.

(56) References Cited

U.S. PATENT DOCUMENTS 5,397,934 A * 3/1995 Merrill .................... G05F 3/242
327/534
6,466,077 B1  10/2002 Miyazaki et al.
(Continued)

OTHER PUBLICATIONS

PCT International Search Report and Written Opinion, PCT International Application No. PCT/EP2014/054229, dated Jun. 5, 2014.
(Continued)

*Primary Examiner* — William Hernandez
(74) *Attorney, Agent, or Firm* — McDonnell Boehnen Hulbert & Berghoff LLP

(57) ABSTRACT

The present disclosure relates to a detection circuit formed as part of an integrated circuit. In one example, the detection circuit includes a signal generator configured to generate a reference signal, and an amplification circuit comprising a p-channel transistor and an n-channel transistor, wherein the amplification circuit is affected by a variability that also affects a functional circuit formed as part of the integrated circuit. The variability causes the p-channel transistor and the n-channel transistor to have different respective drive strengths. The amplification circuit is configured to receive the reference signal and to provide an amplified signal representative of a difference in the respective drive strengths, wherein the reference signal is more insensitive to the variability than the amplified signal. The present disclosure also relates to an integrated circuit and a method for detecting and compensating a transistor mismatch.

17 Claims, 7 Drawing Sheets

(51) Int. Cl.
  *G11C 29/02* (2006.01)
  *G01R 17/02* (2006.01)
  *G11C 29/50* (2006.01)

(52) U.S. Cl.
  CPC ......... *G11C29/028* (2013.01); *H03K 19/0027* (2013.01); *G11C 2029/5002* (2013.01); *H03K 2217/0018* (2013.01)

(56) References Cited

U.S. PATENT DOCUMENTS

| | | | | |
|---|---|---|---|---|
| 6,529,421 | B1 * | 3/2003 | Marr | G11C 5/147 |
| | | | | 327/534 |
| 6,653,890 | B2 | 11/2003 | Ono et al. | |
| 6,731,158 | B1 | 5/2004 | Hass | |
| 7,532,059 | B2 * | 5/2009 | Naritake | G05F 3/205 |
| | | | | 327/534 |
| 7,548,822 | B2 | 6/2009 | Chuang et al. | |
| 7,564,296 | B2 * | 7/2009 | Ito | H03K 19/00384 |
| | | | | 323/312 |
| 2003/0080802 | A1 * | 5/2003 | Ono | H03K 19/00384 |
| | | | | 327/534 |
| 2005/0280463 | A1 * | 12/2005 | Chih | G05F 3/205 |
| | | | | 327/538 |
| 2007/0018864 | A1 * | 1/2007 | Khan | H03K 19/00384 |
| | | | | 341/118 |
| 2007/0045744 | A1 | 3/2007 | Ito | |
| 2007/0085596 | A1 | 4/2007 | Ito | |
| 2007/0236277 | A1 | 10/2007 | Naritake | |
| 2011/0012672 | A1 * | 1/2011 | Ogawa | G05F 3/205 |
| | | | | 327/537 |
| 2015/0016195 | A1 * | 1/2015 | Yu | G11C 7/1084 |
| | | | | 365/189.05 |

OTHER PUBLICATIONS

Pu, Yu et al., "Vt Balancing and Device Sizing Towards High Yield of Sub-Threshold Static Logic Gates", Proc. ISLPED, Aug. 27-29, 2007, pp. 355-358.

Gattiker, Anne et al., "Using Well/Substate Bias Manipulation to Enhance Voltage-Test-Based Defect Detection", 2011 IEEE International Test Conference (ITC), Sep. 20-22, 2011, pp. 1-6.

Ono, Goichi et al., "Threshold-Voltage Balance for Minimum Supply Operation", IEEE Journal of Solid-State Circuits, vol. 38, No. 5, May 2003, pp. 830-833.

Ghosh, Amlan et al., "Slew-Rate Monitoring Circuit for On-Chip Process Variation Detection", IEEE Transactions on Very Large Scale Integration (VLSI) Systems, Nov. 15, 2012, pp. 1-10.

* cited by examiner

CIRCUIT AND METHOD FOR DETECTION AND COMPENSATION OF TRANSISTOR MISMATCH

CROSS REFERENCE TO RELATED APPLICATIONS

The present application is a U.S. national stage application of International Application Serial No. PCT/EP2014/054229 filed on Mar. 5, 2014, which claims priority to European Patent Application No. 13158266.0 filed on Mar. 7, 2013, the contents of each of which are hereby incorporated by reference.

TECHNICAL FIELD

The present disclosure relates generally to a circuit and a method for detection and compensation of transistor mismatch in an integrated circuit affected by variabilities such as process, voltage, and temperature variations.

BACKGROUND

There are multiple sources of variations that may affect an integrated circuit, such as process (P) variation, supply voltage (V) variation, and operating temperature (T) variation, often referred to as PVT corners. Each source of variation may affect the entire integrated circuit or part of it. For example, the temperature variation caused by changes in ambient temperature may affect all the transistors and interconnects on an integrated circuit in the same way, while the temperature differences due to the presence of a temperature gradient (e.g., the presence of hot spots) on the integrated circuit may cause different parts of the integrated circuit to operate at different temperatures.

Process variations due to die-to-die and intra-die variations may cause significant differences between the designed and the manufactured functional circuits in nanometer technologies as process tolerances might not scale proportionally with the design dimensions, causing the relative impact of variations to increase with every new technology generation. Precise detection and compensation schemes to mitigate variations and optimize the post-fabrication operating characteristics of a functional circuit to meet its target frequency and power consumption have become useful for yield enhancement and improvement.

Some conventional solutions include designing functional circuits with excessive design margin to deal with process variation and to help ensure the circuit meets its required timing. Other known solutions consist of a sensor circuit determining the extent of a process variation followed by a compensation circuit that alters the operating characteristics of the functional circuit appropriately. As such, the efficiency of the compensation scheme may depend on the accuracy of the detection (sensor) circuit. Some of these schemes are based on monitoring the delay of the critical path of the functional circuit, such as an inverter chain or a replica circuitry. Consequently, either the supply voltage is adjusted or the threshold voltage is modulated by changing the bias voltage applied to the circuit transistors.

The variation of fabrication parameters when designing an integrated circuit (i.e., a functional circuit) is defined as process variation. Process corners represent the extremes of these parameter variations within which the circuit may function correctly. P-channel and n-channel transistors fabricated at these process corners may run slower or faster than specified and at lower or higher temperatures and voltages. Such mismatches between PMOS and NMOS transistors may affect the circuit characteristics. For example in a skewed corner, one transistor (e.g., p-channel) may switch much faster than the other (e.g., n-channel), which causes imbalanced switching which in turn may result in cells failing. In near threshold operation, when a functional circuit operates at a voltage near the threshold voltage of the transistors, the effect of skewed corners may become even more pronounced. As a result, the minimum operating supply voltage for skewed corners is higher than for even corners (for example when both NMOS and PMOS transistors switch faster). Balanced N and P transistors may enable lower circuit operating voltage and power, while providing a higher static noise margin. Any mismatch between these two types of transistors may cause degradation of the noise margin, minimum operating voltage, and also performance and power of the circuit.

In the paper "Vr Balancing and Device Sizing Towards High Yield of Sub-threshold Static Logic Gates" (Y Pu et al, *Proc. ISPLED*, pp. 355-358, August, 2007) a digital solution for detection of the difference between the PMOS and NMOS transistor mismatches has been proposed.

SUMMARY

According to one embodiment, the present disclosure relates to a detection circuit formed as part of an integrated circuit, the detection circuit comprising: a signal generator configured to generate a reference signal; and an amplification circuit comprising a p-channel transistor and an n-channel transistor, the amplification circuit being affected by a variability also affecting a functional circuit formed as part of the integrated circuit, the variability causing the p-channel transistor and the n-channel transistor to have different respective drive strengths, and the amplification circuit being configured for receiving the reference signal and for providing an amplified signal representative of a difference in the respective drive strengths, wherein the reference signal is more insensitive to the variability than the amplified signal.

According to an embodiment of the present disclosure, the signal generator generates a reference voltage with a value negligibly affected by variabilities such as process variations, temperature, and/or voltage variations. Thus, the amplification circuit, which by design is sensitive to such variabilities, amplifies and skews this reference voltage. According to an embodiment, the circuit may detect both manufacturing process variation as well as variation caused by aging and change in ambient temperature. Advantageously, the circuit does not require an external voltage generator, and is able to operate within a wide range of supply voltages. In addition, it has fewer components, it is less susceptible to local variation and therefore it has lower design complexity. The circuit may be implemented fully in digital CMOS which makes it easily portable across different technology.

According to one embodiment, the signal generator comprises components configured to operate as two diodes conducting and connected in series. Advantageously, the signal generator is able to generate a reference signal insensitive to variabilities within a wide range of supply voltages, for example 0.3-1.1 V in a 40 nm technology.

According to another embodiment, the signal generator is designed for reducing voltage fluctuations of the generated reference signal in the presence of variabilities.

In another embodiment, the components of the signal generator are sized such that the voltage fluctuations are reduced to about 1%.

According to another embodiment, the present disclosure relates to an integrated circuit comprising at least one circuit for detecting transistor mismatch.

In another embodiment, the integrated circuit comprises a control circuit configured for receiving the amplified signal of the circuit for detecting transistor mismatch and for generating at least one bias voltage to be applied to at least one pair of a p-channel and an n-channel transistor in the functional circuit for compensating a difference in drive strength of the transistors. The amplification circuit of the circuit for detecting transistor mismatch may provide a sufficient amplification, such that a skew in its output signal is observed which in turn can be processed by a simple control circuit and then compensated. As such, the amplification defines the resolution (i.e. detectability precision) of the detection circuit.

According to another embodiment, the at least one bias voltage is further applied to at least one pair of a p-channel and an n-channel transistor in the amplification circuit for compensating the difference in drive strength of the transistors, and wherein the control circuit is further configured for detecting that the difference in drive strength is compensated, based on a voltage change in the amplified signal.

Advantageously, the detection circuit detects a drive strength difference, representative of the transistors' mismatch, which is then processed by the control logic circuit. In turn, the control circuit generates a bias voltage(s) which is applied to the respective transistor(s) to compensate for the detected drive strength difference. To achieve better accuracy in case of presence of more random within-die variations, multiple detection circuits may be used across the integrated circuit. In addition, different bias voltages for both NMOS and PMOS transistors may be generated, which allows for operation in wide range of supply voltages.

According to one embodiment, the control circuit comprises a memory for storing the at least one bias voltage and is further configured for selecting at least one bias voltage which reduces a leakage power of the functional circuit.

In another embodiment, the control circuit is configured for generating a first bias voltage for the p-channel transistor and a second bias voltage for the n-channel transistor.

According to an embodiment, the present disclosure relates to a device comprising an integrated circuit according to the previous embodiments.

According to another embodiment, the present disclosure relates to a method comprising: generating a reference signal, and amplifying the reference signal with an amplification circuit so as to provide an amplified signal representative of a difference in respective drive strengths of a p-channel transistor of a functional circuit and an n-channel transistor of the functional circuit, wherein the functional circuit is formed as part of an integrated circuit, the integrated circuit being affected by a variability causing the p-channel transistor and the n-channel transistor to have different respective drive strengths, wherein generating the reference signal comprises generating a reference signal more insensitive to the variability than the amplified signal.

In one embodiment, the present disclosure relates to a method wherein the amplified signal is also representative of a difference in respective drive strengths of a p-channel transistor of the amplification circuit and an n-channel transistor of the amplification circuit, the method further comprising: receiving the amplified signal and generating a bias voltage based on the amplified signal, and providing the bias voltage to a transistor of the functional circuit.

In another embodiment, the method further comprises, applying the bias voltage to the p-channel transistor of the amplification circuit or the n-channel transistor of the amplification circuit; and detecting that the difference in drive strength between the p-channel transistor of the amplification circuit and the n-channel transistor of the amplification circuit is compensated.

In a further embodiment, the method further comprises storing the bias voltage in a memory, and selecting from the memory at least one bias voltage which reduces a leakage power of the functional circuit.

The disclosure is also related to a method wherein generating the bias voltage comprises generating a first bias voltage for a p-channel transistor and a second bias voltage for an n-channel transistor.

According to another embodiment, the method performs a search to find bias voltage pairs that equalize the drive strength of NMOS and PMOS transistors and stores them in a memory. From these pairs, the one that reduces the leakage—the pair with the minimum sum—is selected and applied to the amplification circuit of the circuit for detecting transistor mismatch and the functional circuit. This way, the functional circuit has a reduced power consumption while still operating correctly. Furthermore, the method may be executed before or during the operation of the functional circuit. This allows for compensation of transistor mismatches due to variabilities, such as process, temperature, and voltage variations as well as aging.

In another embodiment, the step of generating at least one bias voltage comprises generating a first bias voltage for the p-channel transistor and a second bias voltage for the n-channel transistor.

According to an embodiment, the proposed solution may be relevant for emerging systems operating at near-threshold voltage in which the impact of process variation becomes more pronounced (even in older CMOS technologies). Functional failure may occur due to a skewed corner. Furthermore, according to another embodiment, the proposed solution may be also used to tune a functional circuit under evaluation by applying an appropriate bias voltage. According to another embodiment, the proposed solution may be applicable for nanometer CMOS technologies where large process variation eliminates the classic worst-case design as a viable solution.

The methods for detecting and compensating of the present disclosure, offer a number of advantages. For example, they can be applied during the life time of the circuit when the functional circuit is not in-use (e.g. at idle cycles) which allows mitigation of transistor mismatch due to manufacturing process variation as well as variation caused by aging and change in ambient temperature. As a result, the functional circuit may correctly operate at lower supply voltages. Furthermore, the method for compensating is capable of subsiding threshold mismatches (differences in drive strength) between NMOS and PMOS transistors while still providing a leakage optimal solution. The proposed detection circuit and the control circuit do not require an external reference voltage and may be applied not only to low voltage operation (e.g. near threshold), but to a wide range of supply voltages. The methods also allow for reduced power consumption even when threshold voltage $V_{TH}$ mismatches between NMOS and PMOS transistors result in a nearly identical delay but poorer power characteristics as compared with a nominal operating corner. In addition, both circuits may be implemented fully in digital CMOS which makes these circuitries easily portable across different technologies. The circuitries have the advantages of having less components, being less susceptible to local variation and therefore offer less design complexity.

Certain objects and advantages of various new and inventive aspects have been described above. It is to be understood that not necessarily all such objects or advantages may be achieved in accordance with any particular embodiment of the present disclosure. Those skilled in the art will recognize that the solution of the present disclosure may be embodied or carried out in a manner that achieves or optimizes one advantage or group of advantages without necessarily achieving other objects or advantages.

BRIEF DESCRIPTION OF THE DRAWINGS

For a better understanding of the present disclosure, some embodiments are described below in conjunction with the appended figures and detailed description, wherein.

DETAILED DESCRIPTION

Figure 1:
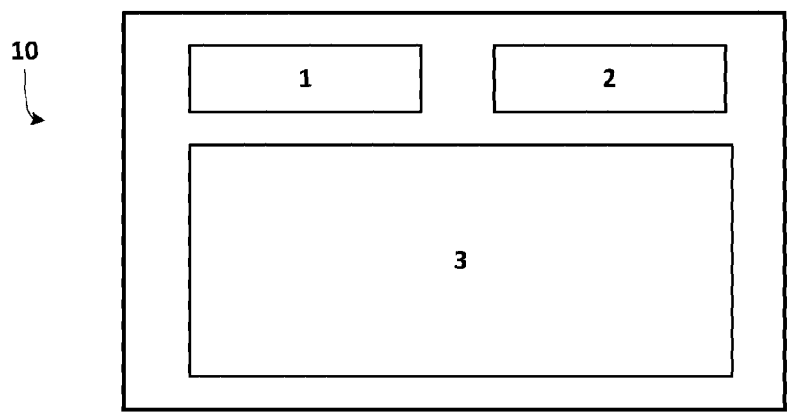
FIG. 1 illustrates an integrated circuit according to one embodiment.

The present disclosure will be described with respect to particular embodiments and with reference to certain drawings but the disclosure is not limited thereto. The drawings described are only schematic and are non-limiting. In the drawings, the size of some of the elements may be exaggerated and not drawn to scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In other instances, well-known methods, structures and techniques have not been shown in detail in order not to obscure an understanding of this description.

In the context of the present disclosure, the term "die" and "integrated circuit" are used at times interchangeably to refer to electronic circuits fabricated using semiconductor materials that provide certain functions or operations. The term "functional circuit" is used at times to refer to the circuit part of the integrated circuit providing the "intended" functionality and to distinguish from other circuits which assist and control its operation.

Hereto, in the context of the present disclosure, the term "process variation(s)" is used at times to refer to the deviations in a transistor and interconnect parameters due to semiconductor fabrication processes, wherein the term "variabilities" may be used to refer to different sources of variations including process, temperature, and/or voltage variabilities.

The term "drive strength" may refer to the drain-source current of a transistor when the transistor is on. The difference of drive strength between transistors may define their mismatch.

Process variation is a term used at times to refer to a variation of fabrication parameters when designing an integrated circuit (i.e., a functional circuit). Process corners represent the extremes of these parameter variations within which the circuit may function correctly. A p-channel transistor and an n-channel transistor fabricated at these process corners may run slower or faster than specified and at lower or higher temperatures and voltages. Process corners are, named with two-letter designators, where the first letter refers to the N-channel MOSFET (NMOS) corner, and the second letter refers to the P channel (PMOS) corner. In this naming convention, for each transistor type (NMOS or PMOS) three corners may exist: typical (nominal), fast (high) and slow (low), where fast and slow corners exhibit faster and slower than normal (typical) transistors performance, respectively. For example, a corner designated as FS, denotes fast NMOS and slow PMOS transistors. Five possible corners include: typical-typical (TT), fast-fast (FF), slow-slow (SS), fast-slow (FS), and slow-fast (SF). The first three corners (TT, FF, SS) are called even corners, because both types of transistors are affected evenly, and generally do not adversely affect the logical correctness of the circuit. Thus, these transistors can function at slower or faster clock frequencies. The last two corners (FS, SF) are called skewed corners, because one of the NMOS or PMOS transistors will switch much faster than the other, thus forming imbalanced switching which can cause one transistor at the output to switch much faster than the other. This may result in failing cells, both (e.g., combinatorial and latching cells), especially when operating near-threshold supply voltage.

As described previously, a process variation may result in parametric yield loss, which may refer to the yield loss associated with dies that exhibit correct functionality but do not meet the target performance requirements such as speed, peak power, or standby current. In near threshold operation, when a functional circuit operates at a voltage near the threshold voltage of the transistors, the effect of skewed corners may become even more pronounced. As a result, the minimum operating supply voltage for skewed corners may be higher than for even corners.

In one aspect the present disclosure relates to a circuit for detecting transistor mismatch. Referring to FIG. 1, the detection circuit 1 detects, in a functional circuit 3, a difference in drive strength, defined as the drain-source current of a transistor when it is on, between N-channel and P-channel transistors. As both the detection circuit 1 and the functional circuit 3 include p-channel and n-channel transistors and are located on the same integrated circuit 10, as shown in FIG. 1, both circuits are susceptible to the same or similar variabilities. Once a transistor mismatch is detected by the detection circuit 1, a control circuit 2 generates at least one bias voltage to compensate for the detected transistor mismatch. The bias voltage(s) is applied to the detection circuit 1 and adjusted until the transistor mismatch is compensated. The compensation is thus a gradual process. The bias voltage(s) may be applied to the functional circuit 3 at the same time or perhaps only after the detection circuit 1 indicates a compensated transistor mismatch.

Figure 2:
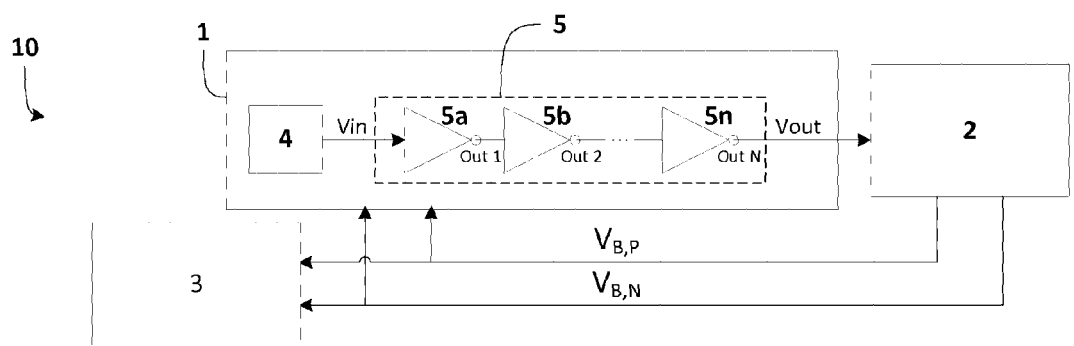
FIG. 2 illustrates an integrated circuit according to another embodiment.

Process (parameter) variabilities define the variation of the process parameters from the TT corner and are categorized as die-to-die and within-die variations. A die-to-die variation affects all the transistors on a die (i.e. integrated circuit 10) in a similar fashion and is often modeled as a process parameter shift (e.g. a shift in $V_{TH}$ of all transistors on the die), while a within-die variation affects individual transistors on a die or a group of transistors in close mutual proximity. For integrated circuits in older technologies or with small area (size), the die-to-die variations are dominant. In these cases, the detection circuit 1 and the functional circuit 3 may experience similar trends of process, temperature, and voltage variations. In cases where within-die process variations are not negligible, multiple detection circuits could be deployed in different locations on the integrated circuit, each of them sensing and controlling the variability of different regions of the integrated circuit. In this case, the integrated circuit may be partitioned to multiple regions with controlled bias voltage, according to the within-die process variation. When the detection circuit 1 is used for detecting PMOS and NMOS transistor mismatch caused not only by process variations but also by temperature and/or voltage variations, the same principle holds. For example, in the case of no within-die temperature gradient and only ambient temperature variation, the detection circuit 1 and the functional circuit 3 may experience the same variation. In the cases of temperature difference between different regions of the integrated circuit, multiple detection circuits can be employed. The circuit 1 may determine the extent of variations which when compensated allows the functional circuit 3 to operate appropriately. The circuit 1, as shown in more detail in FIG. 2, includes a signal generator 4 and an amplification circuit 5. The signal generator 4, in contrast to conventional solutions, generates a signal insensitive to variabilities (process, temperature and/or voltage variations). The generated signal value does not change significantly in the presence of such variations. The amplification circuit 5, however, experiences the same or similar variations as the functional circuit 3. In other words, the amplification circuit 5 behaves similarly to the functional circuit 3 and mimics the variabilities of the functional circuit 3.

As explained previously, these variabilities may cause mismatches in the drive strength between p-channel and n-channel transistors. To detect the difference in drive strength of the PMOS and NMOS transistors in a functional circuit 3, in contrast to e.g. Pu et al., where the whole detection circuit is designed as sensitive to variabilities, in the present example, only the amplification circuit 5 is designed to be sensitive to variabilities.

The amplification circuit 5 receives as an input signal Vin, the signal generated by the signal generator 4, i.e. Vin=$V_{DD}$/2, and outputs an amplified signal Vout. As the input signal Vin passes through the amplification circuit 5, it gets skewed in a similar manner as it would by the functional circuit 3. Thus, if the amplification circuit 5 (and the functional circuit 3) is skewed toward e.g., the SF or the FS corner—depending on the process variation of the integrated circuit 1 and the temperature and voltage variations—the signal outputted by the amplification circuit Vout is a skewed amplified signal which would be greater or lower than input signal Vin (e.g., greater or less than $V_{DD}$/2). The output at the amplification circuit 5 is, therefore, either a logic "1" (e.g. defined as at least 70% of $V_{DD}$ or at least 90% of $V_{DD}$) or a logic "0" (e.g. defined as no more than 30% of $V_{DD}$ or no more than 10% of $V_{DD}$), which may be an indication of a transistor mismatch.

Figure 4:
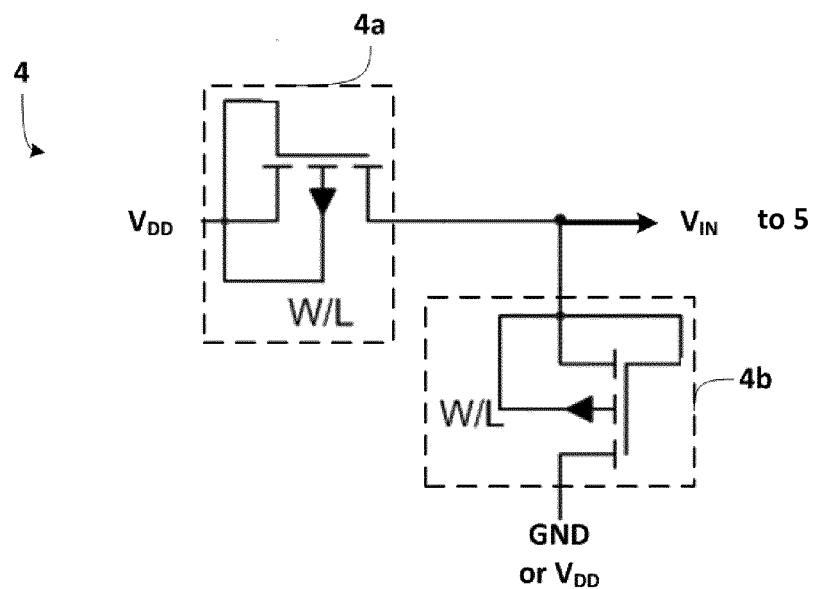
FIG. 4 illustrates a circuit schematic of a signal generator according to an embodiment.

In an example embodiment, the signal generator 4 as shown in FIG. 4, is designed to be more insensitive to variabilities than the amplification circuit 5. It comprises a pair of diodes 4a, 4b that are conducting and connected in series. Each diode 4a and 4b may be a PMOS transistor in a conducting diode configuration, i.e. with connected gate and source terminals. However, other implementations, such as transistors configured as a conducting diode, NMOS and PMOS transistors as non-conducting diodes, as well as implementations with passive elements such as resistors are also possible. At its input, the signal generator 4 receives ground (GND) and outputs a voltage that is half of the supply voltage Vin=$V_{DD}$/2. The signal generator 4 functions as a voltage divider generating an accurate $V_{DD}$/2, therefore, eliminating the need for an external (analog) reference voltage. The accuracy is defined as $$\max\left(\text{abs}\left(\frac{\frac{V_{DD}}{2} - (\mu \pm 3\sigma)}{\frac{V_{DD}}{2}}\right)\right) \times 100.$$

The sizing of the two transistors (4a, 4b) affects the accuracy of the generated signal Vin in the presence of variation. PMOS transistors provide a more accurate output voltage, especially at lower operating voltages. The input voltage of the signal generator is set to GND during functional mode to generate $V_{DD}$/2 at its output, which during non-functional mode is set to $V_{DD}$ to save power.

TABLE 1

| Size | [µ − 3σ µ + 3σ] $V_{DD}$ = 1.1 V | [µ − 3σ µ + 3σ] $V_{DD}$ = 0.3 V |
| --- | --- | --- |
| W = 0.9 µm, L = 0.04 µm | [0.5338 0.5660] | [0.1330 0.1668] |
| W = 0.9 µm, L = 0.1 µm | [0.5383 0.5618] | [0.1377 0.1625] |
| W = 13.2 µm, L = 0.04 µm | [0.5454 0.5546] | [0.1455 0.1545] |
| W = 13.2 µm, L = 0.1 µm | [0.5470 0.5531] | [0.1469 0.1531] |

Table 1 shows statistics of the generated $V_{DD}/2$ for different sizes of the transistors 4a, 4b in the presence of random within-die process variation in a 40 nm technology. The generated $V_{DD}/2$ voltage is shown in the range of µ±3σ, where µ and σ are the mean and the standard variation of the generated $V_{DD}/2$ distribution respectively. An accuracy of close to 1% is achieved for a nominal supply voltage of $V_{DD}$=1.1 V. Additionally, at lower $V_{DD}$, a longer channel length (e.g. L=0.1 µm for a 40 nm technology) is used to achieve an increased accuracy. Similar results were observed for other process corners, i.e. FF, SS, SF, and TT. The table also shows the statistics of generated $V_{DD}/2$ for $V_{DD}$=0.3 V. With these sizings, an accuracy of 2% can be achieved. An improved accuracy (e.g., 1%) of $V_{DD}/2$ can be achieved by further increasing the size of the transistors.

A potential advantage of the proposed signal generator 4 is that it is able to generate a reference signal Vin that is insensitive to variabilities for a wide range of supply voltages, such as 0.3-1.1 V in a 40 nm technology.

In one embodiment, the signal generator 4 may be implemented with basic components only (i.e. PMOS or NMOS transistors) which allows it to be integrated on the same integrated circuit as the functional circuit 3.

In another embodiment, the detection circuit 1 needs to provide a sufficient resolution in detectability of the difference in drive strength. This resolution (i.e. detectability precision) is defined by the amount of amplification of the input signal Vin. Thus, the amplification circuit 5 needs to provide a sufficient amplification, such that a skew in the output signal Vout can be processed by a simple control circuit 2 and then compensated. The amplification circuit 5 comprises at least one logical gate 5a-5n connected in series to the signal generator 4. In some examples, the logic gate(s) 5a-5n can be inverters. The inverter cell sizing and the number of amplification stages affect the sensitivity of the control circuit 2 and in turn the accuracy of the generated bias voltage.

In another embodiment, the control circuit 2 comprises a controller and a bias generator circuit (not illustrated in the figures). The controller may be implemented in hardware or in software. For example, if implemented in software a simple microcontroller or a microprocessor may be used to realize its function. The bias generator circuit may be implemented as a digital or analog circuit as well.

Figure 3:
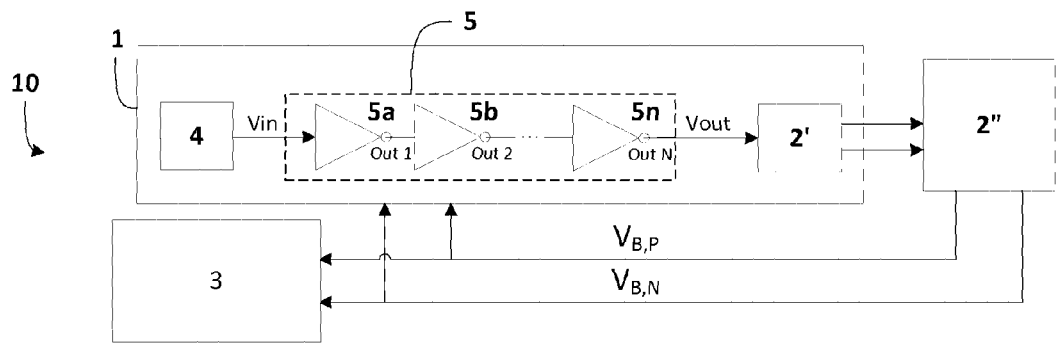
FIG. 3 illustrates an integrated circuit according to a further embodiment.

In another embodiment, the detection circuit 1 may include some of the functionalities of the control circuit 2 as shown in FIG. 3. The control circuit 2 can be split into a first control circuit 2' and a second control circuit 2", wherein the first control circuit 2' is part of the detection circuit 1. In this case, the first control circuit 2' may generate voltage signals $V_{B,N}$, $V_{B,P}$ representative of the drive strength of each p- and n-channel transistor. The rest of the functionality of the control circuit 2 may be provided by the second control circuit 2".

In another aspect the present disclosure relates to an integrated circuit 10 comprising at least one detection circuit 1. In order to compensate for transistor mismatch and bring transistors' performance (for example to reduce the threshold voltage $V_{TH}$ variations) of the functional circuit 3 closer to the transistors' performance of a TT corner, either the NMOS or the PMOS transistors, or both, can be forward and/or reverse biased by applying a bias voltage to the transistor's bulk terminal. The amplified signal Vout at the output of the detection circuit 1 is thus provided as an input for a control circuit 2 which generates at least one voltage signal $V_{B,N}$, $V_{B,P}$ for compensating the detected difference in drive strength. The generated signal(s) $V_{B,N}$, $V_{B,P}$ is then applied to both the functional circuit 3 and the amplification circuit 5 of the detection circuit 1.

In comparison to a conventional solution, the proposed detection circuit 1 may operate with a wide range of supply voltages (e.g. 0.3 V-1.1 V), because (i) the output of detection circuit 1 is processed by the control circuit 2 and (ii) the control circuit 2 generates different bias voltages $V_{B,N}$, $V_{B,P}$ for each of the NMOS and PMOS transistors for balancing their drive strength.

In one embodiment, the amount of the bias voltage to be applied can be determined, for example, in an iterative manner. The bias voltage values $V_{B,N}$, $V_{B,P}$ can be increased or decreased in steps until the output of the amplification circuit 5 changes from one binary value to another. For example, if the amplification circuit 5 and the functional circuit 3 exhibit a skewed SF corner, then the output signal of the amplification circuit 5 Vout would be a logic "1". In this case, a bias voltage is applied to the PMOS or NMOS transistor, or both, until the Vout changes from a logic "1" to a logic "0." The change of the output voltage is an indication for a compensated transistor mismatch. For a nominal voltage (e.g. $V_{DD}$=1.1 V), the $V_{B,P}$ and $V_{B,N}$ may be set within the range of $V_{DD} \pm V_{DD}/2$ and $\pm V_{DD}/2$ respectively. These ranges change depending on the process technology and the operating voltage. For example, for an operation voltage closer to the threshold voltage of the transistors, the $V_{B,N}$ range can be set to $\pm 2V_{DD}$.

The accuracy of the bias voltages $V_{B,N}$, $V_{B,P}$ depends on how tight the distribution of the bias voltage is at which the output of the detection circuit 1 toggles in the presence of variabilities (e.g. within-die process variation), as well as, how precisely the bias voltage is set independent of observing a logic "0" or a logic "1" at the output of the amplification circuit 5.

Different inverter cell sizes such as INVERTER12, INVERTER24, or INVERTER8×24 may be used for the inverters of the amplification circuit 5. Herein, INVERTER represents an inverter with N and P transistors with a drive strength similar to a TT corner and the number (e.g. 12, 24, and 8×24) represents its drive strength. The impact on bias voltage distribution for detecting a logic "0" or a logic "1" are similar. It has been observed that the drive strength of the inverter has an impact on reducing the bias distribution from 3σ of more than 200 mV for INVERTER12 to less than 50 mV for the case of INVERTER8×24. If, for example, the required bias voltage precision is 50 mV, using an INVERTER8×24 inverter cell is sufficient; using a larger cell may not yield any extra benefit.

Figure 5:
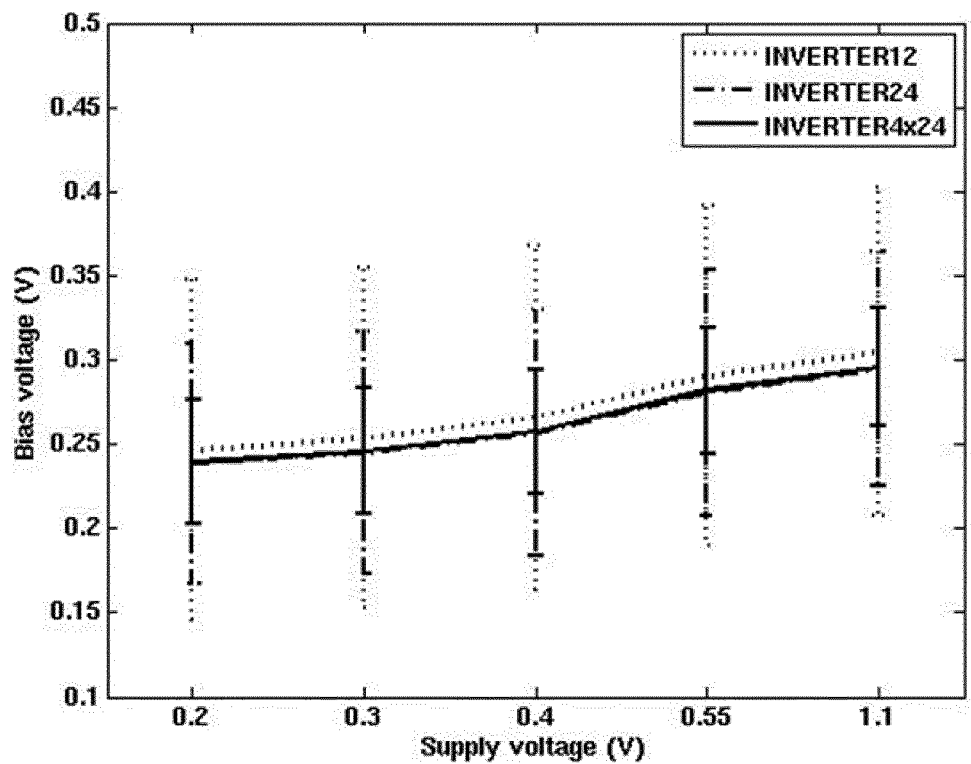
FIG. 5 illustrates a mean and standard deviation of the bias voltage for a logic gate with different drive strengths at different supply voltages according to an embodiment.

FIG. 5 shows the mean µ and variance σ of the bias voltage for different inverter cells at different supply voltages, where the error bar shows the ±3σ variation. The figure shows that by using cells with larger drive strength at each amplification stage, the ±3σ variation of the recommended bias using the proposed solution is reduced independently of the supply voltage. Although, this reduction is more pronounced at lower voltage where 70% reduction in ±3σ was observed using INVERTER4×24 instead of INVERTER12 at 0.2 V as compared to around 40% reduction in nominal voltage of 1.1 V.

Figure 6A:
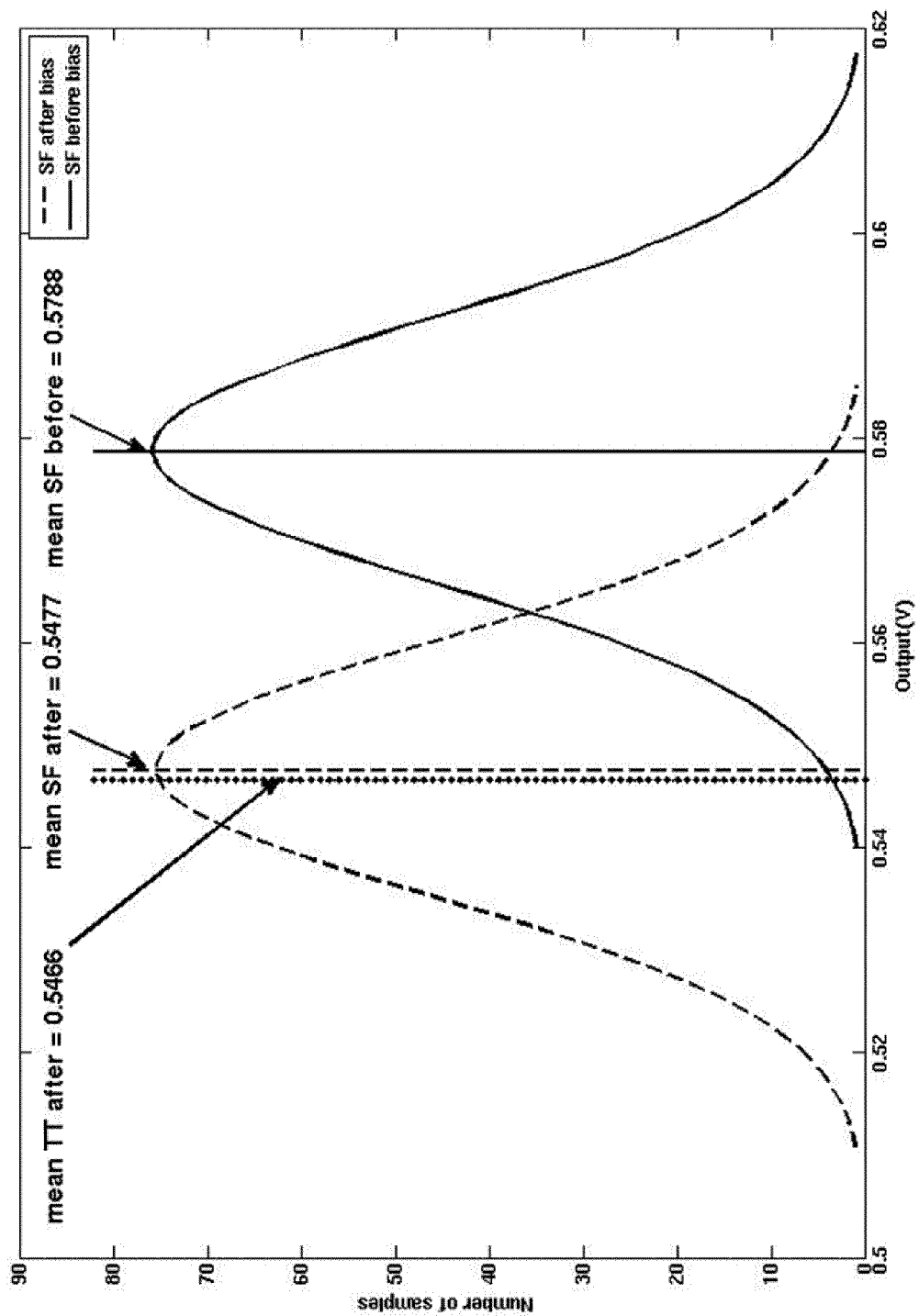
FIG. 6A illustrates an example plot of a skewed SF corner with and without bias voltage correction according to an embodiment.
Figure 6B:
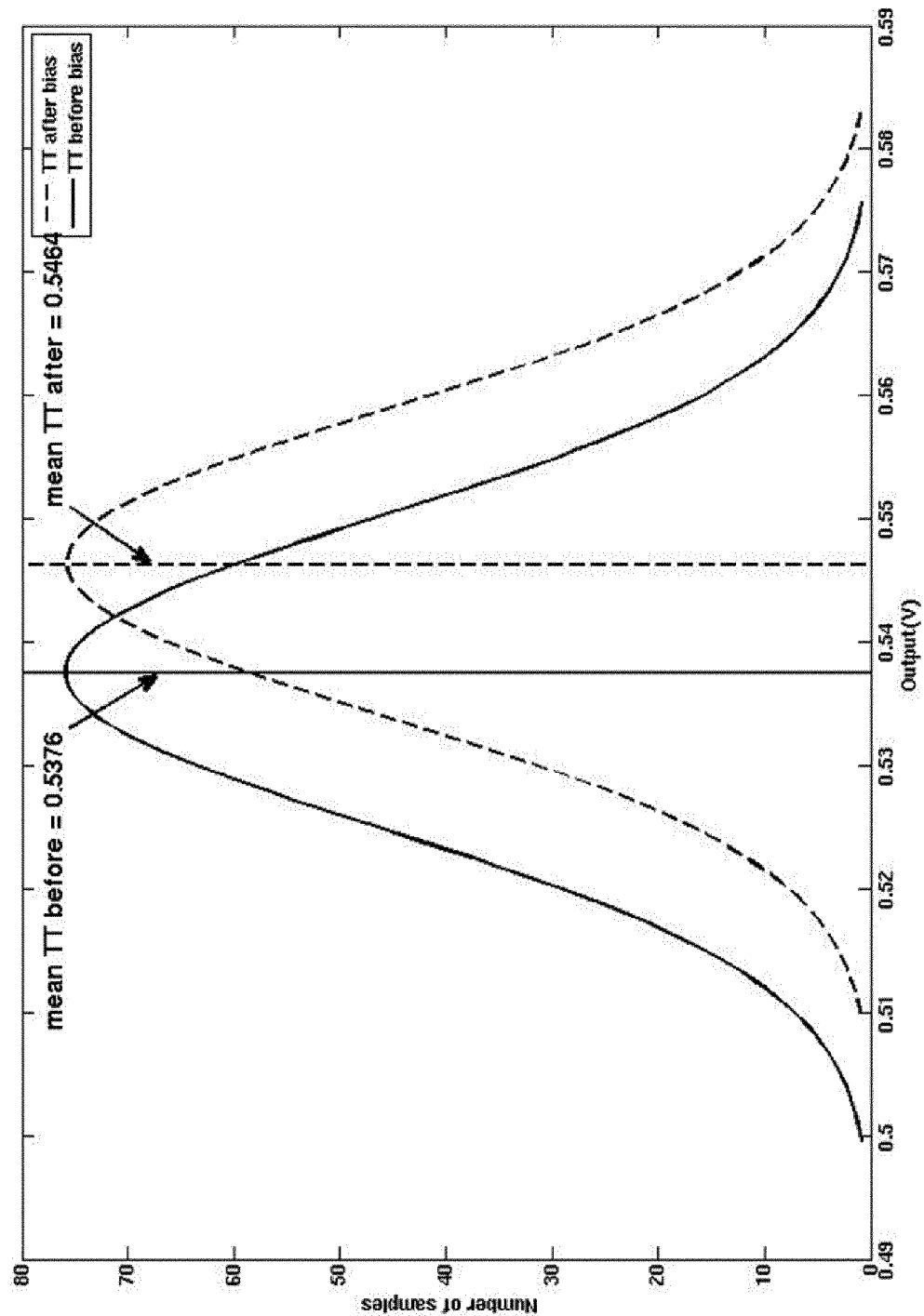
FIG. 6B illustrates an example plot of a nominal TT corner with and without bias voltage correction according to an embodiment.

FIG. 6A and FIG. 6B show an example of a minimum bias voltage(s) $V_{B,N}$, $V_{B,P}$ reducing the gap between the skewed (SF) and nominal (TT) corner for an inverter with its input and output connected together. The output voltage of such inverter, in case of no skew between the NMOS and PMOS transistor, is expected to be close to $V_{DD}/2$. In case of skew between the transistors, applying an appropriate bias voltage to one or each of them, the output voltage of the inverter gate is brought closer to the TT corner (very close to $V_{DD}/2$). Monte-Carlo results in a 40 nm low-power technology illustrated in FIG. 6A show that the proposed detection circuit 1 reduces the gap between the skewed and the typical corners to less than 0.2%. For the case of a nominal TT corner, the inverter output does not change in any significant way (FIG. 6B).

For an inverter with its input and output tied together, a bias precision of 50 mV is enough to bridge the gap between a skewed corner and a TT corner (i.e. to bring the output of such an inverter as close to $V_{DD}/2$ as possible). The impact of higher bias precision (i.e. smaller than 50 mV) on the effectiveness of the detection circuit 1 is negligible.

Figure 7A:
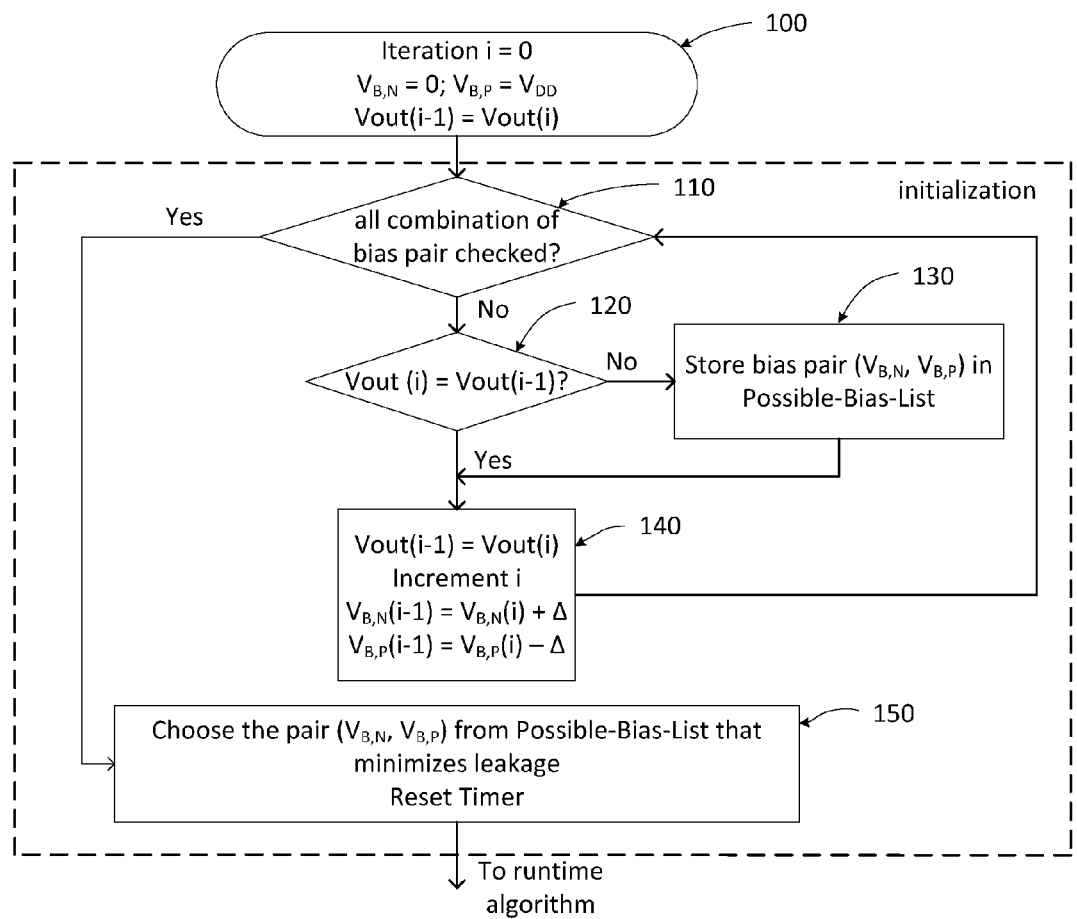
FIG. 7A illustrates a flow chart of the initialization phase of a method for compensating according to an embodiment.

The proposed detection and control circuitries enable the functional circuit 3 to operate at a lower supply voltage, which in turns results in power saving due to both lower dynamic and leakage power. In particular, the use of both forward and reverse biasing of NMOS and PMOS transistors enables leakage power saving. For example, the leakage saving for an FF corner achieved as compared with the case of no biasing, using the proposed circuitry and the algorithm presented as a pseudo-code (FIG. 7A and FIG. 7B), is on average 70.8% and at maximum of 75.6%.

Another aspect of the present disclosure relates to a method for detecting a transistor mismatch, in an integrated circuit 10 affected by variabilities. The variabilities cause a difference in drive strength of p-channel and n-channel transistors in the integrated circuit. The method comprises generating a reference signal Vin followed by amplification of the reference signal. In one embodiment, the reference signal is generated in such a way that it is less affected by variabilities than the amplified signal. Thus, as explained above, the value of the amplified signal Vout is representative of the difference of drive strength between the transistors. For example, in presence of variabilities, due to the difference of drive strength between the transistors, the value of the amplified signal will be different than the value of the reference signal.

Another aspect of the present disclosure relates to a method for compensating a difference in drive strength between a p-channel transistor and an n-channel transistor in a functional circuit 3. The method described herein operates in an iterative fashion to obtain a good bias voltage for compensating the transistors' mismatches. A good bias voltage may refer to the bias voltage or voltages $V_{B,N}$, $V_{B,P}$, applied at the bulk terminal of one of the transistors or both, which brings the transistors' performance closest to the TT corner. The method comprises a step of determining, with the detection circuit 1, as described above, a value representative of the difference in drive strength and a step of generating and adjusting a bias voltage $V_{B,N}$, $V_{B,P}$. The bias voltage is applied to one of the transistors or to both of them until the transistors' mismatches are compensated. For example, at a certain iteration, depending on the output of the detection circuit 1, a bias voltage for the NMOS transistor may be selected. In the following iteration, again based on the detection circuit 1 output, a bias voltage for example for the PMOS transistor may be selected. These two steps are repeated until the transistors' mismatch is compensated. To speed up the method, in one iteration a bias voltage for both the p-channel and the n-channel transistors may be determined. Different bias voltages for each of the p-channel and n-channel transistors may be generated. Additionally, forward and reverse biasing may be applied to either of the NMOS and PMOS transistors. This allows the proposed method to be applicable to a wide supply voltage range (e.g. 0.3 V-1.1 V).

Figure 7B:
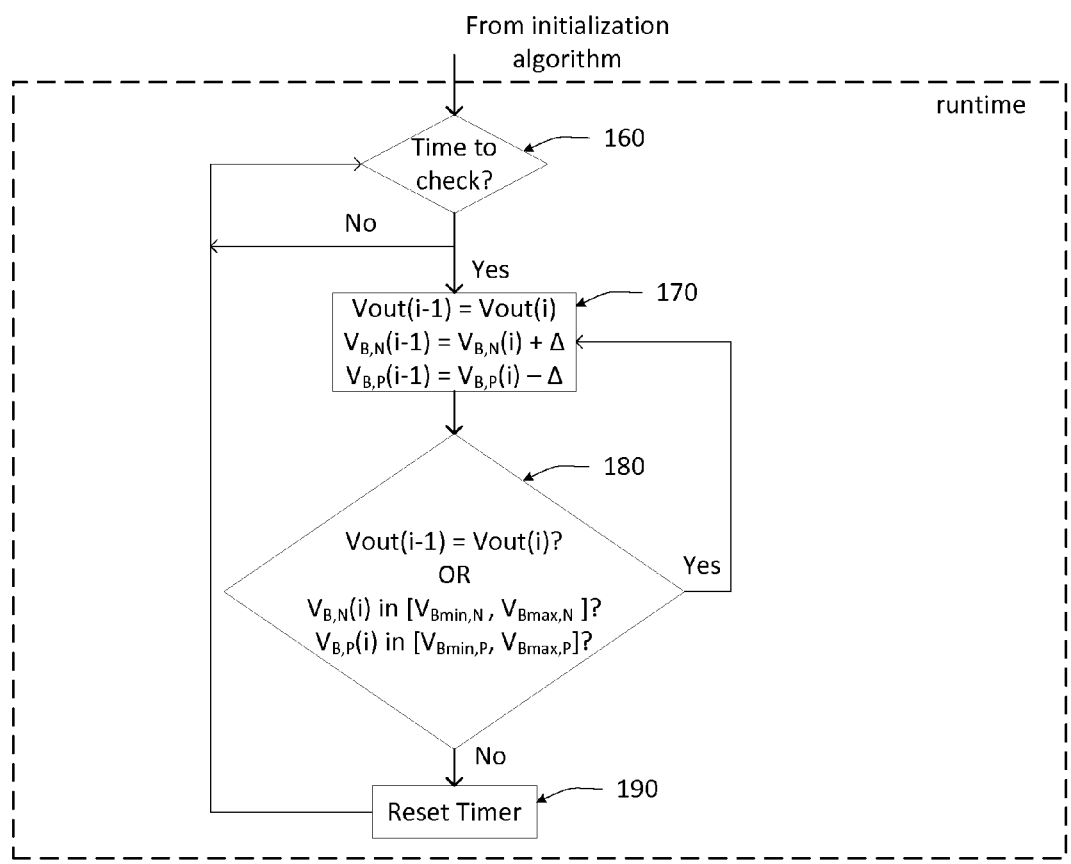
FIG. 7B illustrates a flow chart of the runtime phase of a method for compensating according to an embodiment.

The method may include an initialization phase (FIG. 7A) and a runtime phase (FIG. 7B). The initialization phase may be performed, for example, after fabrication to set the bias of NMOS and PMOS transistors or each time that the integrated circuits restarts. The runtime phase may be performed periodically during circuit operation at a frequency based on the expected rate of changes in process, voltage, and/or temperature, for example, every 10 minutes or every 10 days.

In an example embodiment, at initialization, at step 100 the bias voltages for the PMOS and NMOS transistors are initially set to $V_{B,P}=V_{DD}$ and $V_{B,N}=0$, respectively. At each iteration, at step 140, the $V_{B,P}$ voltage is decreased or $V_{B,N}$ is increased. Optionally, both voltages can be adjusted at the same iteration. The bias voltage(s) are changed until the output (Vout) of the detection circuit 1 changes from one value to another 120, which is an indication for a transistor mismatch that has been compensated.

In another embodiment, the method may include finding all pairs of $V_{B,N}$, $V_{B,P}$ that equalizes the drive strength of NMOS and PMOS transistors. Each pair satisfying the condition of 120 is stored in a memory 130. After completing the search, all bias pairs balancing the transistor mismatch will be stored in the Possible-Bias-List. In one embodiment, at 150 the pair of bias voltages with their sum being a minimum of all the stored bias pairs is selected. The selected pair of bias voltages also may reduce the leakage power of the functional circuit 3.

While the circuit is running, due to temperature and voltage variations and/or aging, the drive strength of the transistors can change. This change is reflected in a change of the output value (Vout) of the detection circuit 1. During the runtime phase, in 160, the method may include checking for changes in the output voltage (Vout) of the detection circuit 1 after predetermined intervals of time. If a change in Vout is detected, the current bias voltages ($V_{B,P}$, $V_{B,N}$)—e.g. the bias voltages as set in the initialization phase—are incrementally changed (simultaneously or in an alternating fashion) 170 until the output (Vout) of the detection circuit 1 changes 180. At block 180, the method includes an additional step of verifying if the bias voltage(s) is within acceptable limits, that is $V_{B,P}=[V_{Bmin,P}, V_{Bmax,P}]$ and $V_{B,N}=[V_{Bmin,N}, V_{Bmax,N}]$, is performed. For example, in a 40 nm technology and $V_{DD}=1.1$ V, the respective limits may be $V_{B,P}=[0.55V-1.65V]$ and $V_{B,N}=[-0.55V-0.55V]$. After a new pair of bias voltages is selected, the period of time is reset 190.

During runtime operation, the variation is expected to be gradual and therefore generally only fine tuning of the bias voltage(s) is required which can be performed without disrupting the operation of the functional circuit 3. Alternatively, a search as in the initialization phase may be performed if sudden changes in PVT are expected or the period of fine tuning is very large.

The possible range for the bias voltage(s) depends on the given $V_{DD}$ and on the transistor type. Different maximum and minimum bias voltage values for each transistor type may be defined. For a nominal voltage of for example $V_{DD}=1.1$ V, the $V_{B,P}$ may be set within the range of $V_{Bmin,P}=V_{DD}-V_{DD}/2$ to $V_{Bmax,P}=V_{DD}+V_{DD}/2$, and $V_{B,N}$ may be set within the range of $V_{Bmin,N}=-V_{DD}/2$ to $V_{Bmax,N}=+V_{DD}/2$. As explained above, these ranges depend on the process technology and the operating voltage. For example, for an operation voltage closer to threshold voltage of the transistors, the $V_{B,N}$ range can be set to $\pm 2V_{DD}$.

Figure 8:
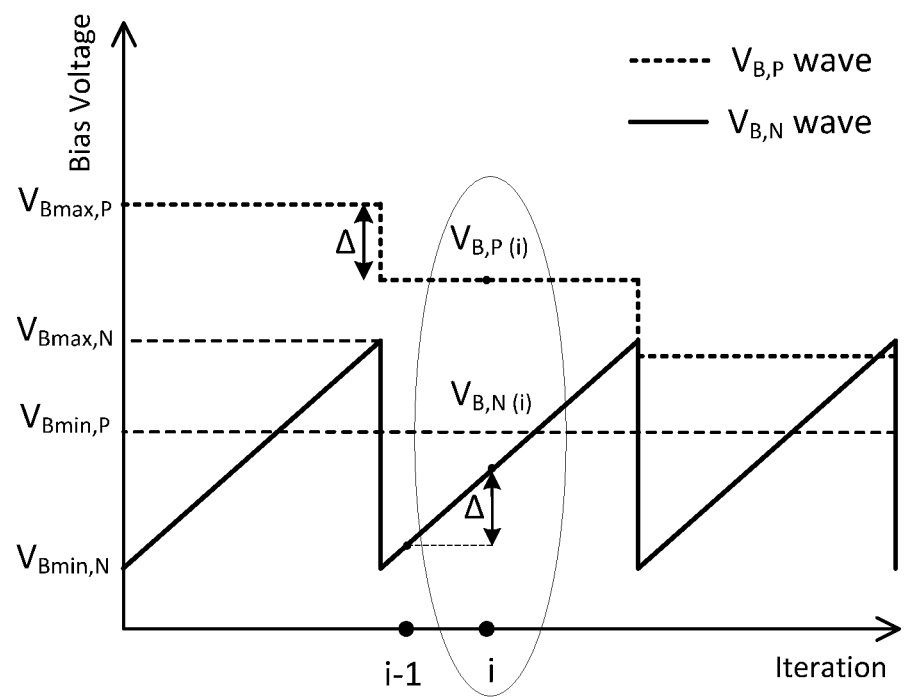
FIG. 8 illustrates an example of bias voltage waveforms for a p-channel transistor and an n-channel transistor, respectively, according to an embodiment.

FIG. 8 shows example waveforms of the search, wherein perhaps all possible bias voltages in the defined bias voltage ranges are explored. The bias voltages are initially set to $V_{B,P}=V_{Bmax,P}=V_{DD}+V_{DD}/2$ and $V_{B,N}=V_{Bmin,N}=-V_{DD}/2$. At each iteration, $V_{B,N}$ is incrementally increased with $+\Delta$ as at step 140. Once $V_{B,N}$ reaches it is maximum value $V_{B,N}=V_{Bmax,N}$, it is reset to its minimum value $V_{Bmin,N}$. At step 140, $V_{B,P}$, however, is decreased by $\Delta$ only when $V_{B,N}$ reaches its maximum value. In this example, only one bias voltage is changed per iteration. This process is repeated until all possible bias voltage combinations are explored. During the search, the pairs of bias voltages which bring the transistors' performance closest to the nominal corner may be saved in a memory 130. A similar search process may be used also for the runtime phase in FIG. 7A.

Advantageously, the detection circuit 1 may be implemented in a digital CMOS making it easily portable across different technologies, and together with control circuit 2, may be capable of alleviating threshold mismatches (differences in drive strength) between NMOS and PMOS transistors. The detection circuit 1 and the control circuit 2 may be applied to a wide operating voltage range (e.g. 0.3 V-1.1 V). The need for an external reference voltage is also avoided. According to at least one embodiment, the proposed solution can mitigate both manufacturing process variation as well as variation caused by aging and change in ambient temperature as it can be applied during the life time of the circuit when the functional circuit is not in-use, for example at idle cycles. In addition, according to at least one embodiment the proposed solution has the advantages of using less components, being less susceptible to local variation, and therefore less design complexity.

The invention claimed is:

1. A detection circuit formed as part of an integrated circuit, the detection circuit comprising:
   a signal generator configured to generate a reference signal; and
   an amplification circuit comprising a p-channel transistor and an n-channel transistor, the amplification circuit being affected by a variability also affecting a functional circuit formed as part of the integrated circuit, the variability causing the p-channel transistor and the n-channel transistor to have different respective drive strengths, and the amplification circuit being configured to receive the reference signal and to provide an amplified signal representative of a difference in the respective drive strengths,
   wherein the reference signal is more insensitive to the variability than the amplified signal.

2. The detection circuit of claim 1, wherein the variability includes at least one of a process variability, a supply voltage variability, or a temperature variability.

3. The detection circuit of claim 1, wherein the signal generator comprises a first component and a second component, wherein the first component and the second component are connected in series, and wherein the first component and the second component are each configured to operate as a conducting diode.

4. The detection circuit of claim 3, wherein the first component and the second component are sized such that voltage fluctuations of the reference signal are less than about 1%.

5. The detection circuit of claim 1, wherein the signal generator is designed for reducing voltage fluctuations of the generated reference signal in the presence of variabilities.

6. An integrated circuit comprising:
   a signal generator configured to generate a reference signal;
   a functional circuit; and
   an amplification circuit comprising a p-channel transistor and an n-channel transistor, the amplification circuit being affected by a variability also affecting the functional circuit, the variability causing the p-channel transistor and the n-channel transistor to have different respective drive strengths, and the amplification circuit being configured to receive the reference signal and to provide an amplified signal representative of a difference in the respective drive strengths,
   wherein the reference signal is more insensitive to the variability than the amplified signal.

7. The integrated circuit of claim 6, wherein the variability includes at least one of a process variability, a supply voltage variability, or a temperature variability.

8. The integrated circuit of claim 6, wherein the functional circuit comprises an n-channel transistor and a p-channel transistor, the integrated circuit further comprising a control circuit configured to receive the amplified signal and to generate a bias voltage to be applied to the p-channel transistor of the functional circuit and the n-channel transistor of the functional circuit for compensating a difference in respective drive strengths of the p-channel transistor of the functional circuit and the n-channel transistor of the functional circuit.

9. The integrated circuit of claim 8, wherein the bias voltage is further applied to the p-channel transistor of the amplification circuit and the n-channel transistor of the amplification circuit for compensating the difference in respective drive strengths of the p-channel transistor of the amplification circuit and the n-channel transistor of the amplification circuit, and wherein the control circuit is further configured to detect that the difference in respective drive strengths of the p-channel transistor of the amplification circuit and the n-channel transistor of the amplification circuit is compensated, based on a voltage change in the amplified signal.

10. The integrated circuit of claim 8, wherein the control circuit comprises a memory for storing data representative of the bias voltage, and wherein the control circuit is further configured to select at least one bias voltage that reduces a leakage power of the functional circuit.

11. The integrated circuit of claim 8, wherein the control circuit is configured to generate a first bias voltage for the p-channel transistor of the functional circuit and a second bias voltage for the n-channel transistor of the functional circuit.

12. A method comprising:
   generating a reference signal, and
   amplifying the reference signal with an amplification circuit so as to provide an amplified signal representative of a difference in respective drive strengths of a p-channel transistor of a functional circuit and an n-channel transistor of the functional circuit, wherein the functional circuit is formed as part of an integrated circuit, the integrated circuit being affected by a variability that causes the p-channel transistor and the n-channel transistor to have different respective drive strengths, wherein generating the reference signal comprises generating a reference signal that is more insensitive to the variability than the amplified signal.

13. The method of claim 12, wherein the amplified signal is also representative of a difference in respective drive strengths of a p-channel transistor of the amplification circuit and an n-channel transistor of the amplification circuit, the method further comprising:

receiving the amplified signal and generating a bias voltage based on the amplified signal, and providing the bias voltage to a transistor of the functional circuit.

14. The method of claim 13, wherein the amplified signal is received by a control circuit.

15. The method of claim 13, further comprising:
applying the bias voltage to the p-channel transistor of the amplification circuit or the n-channel transistor of the amplification circuit; and
detecting that the difference in drive strength between the p-channel transistor of the amplification circuit and the n-channel transistor of the amplification circuit is compensated.

16. The method of claim 13, further comprising:
storing the bias voltage in a memory, and
selecting from the memory at least one bias voltage that reduces a leakage power of the functional circuit.

17. The method of claim 13, wherein generating the bias voltage comprises generating a first bias voltage for a p-channel transistor of at least one of the functional circuit or the amplification circuit and a second bias voltage for an n-channel transistor of at least one of the functional circuit or the amplification circuit.

* * * * *